(12) United States Patent
Takenaka et al.

(10) Patent No.: US 7,816,611 B2
(45) Date of Patent: Oct. 19, 2010

(54) CIRCUIT BOARD

(75) Inventors: Toshiaki Takenaka, Kyoto (JP);
Yoshihiro Kawakita, Katano (JP);
Tadashi Tojo, Katano (JP); Kiyohide Tatsumi, Ikoma (JP)

(73) Assignee: Panasonic Corporation, Osaka (JP)

( * ) Notice: Subject to any disclaimer, the term of this patent is extended or adjusted under 35 U.S.C. 154(b) by 135 days.

(21) Appl. No.: 11/619,860

(22) Filed: Jan. 4, 2007

(65) Prior Publication Data

US 2007/0107931 A1 May 17, 2007

Related U.S. Application Data

(62) Division of application No. 10/502,170, filed as application No. PCT/JP03/17019 on Dec. 26, 2003, now Pat. No. 7,181,839.

(30) Foreign Application Priority Data

| Jan. 14, 2003 | (JP) | ............... 2003-005676 |
| Jan. 14, 2003 | (JP) | ............... 2003-005677 |
| Jan. 14, 2003 | (JP) | ............... 2003-005678 |

(51) Int. Cl.
*H01R 12/04* (2006.01)
*H05K 1/11* (2006.01)

(52) U.S. Cl. .................... 174/262; 174/255

(58) Field of Classification Search ........ 174/254, 174/255, 262
See application file for complete search history.

(56) References Cited

U.S. PATENT DOCUMENTS

| 4,927,742 | A | 5/1990 | Kohm |
| 5,374,469 | A | 12/1994 | Hino et al. |
| 5,470,647 | A | 11/1995 | Zimics et al. |
| 5,481,795 | A * | 1/1996 | Hatakeyama et al. ......... 29/852 |
| 5,719,090 | A | 2/1998 | Appelt et al. |
| 5,928,970 | A | 7/1999 | Appelt et al. |
| 5,959,363 | A * | 9/1999 | Yamada et al. .............. 257/787 |
| 5,972,482 | A | 10/1999 | Hatakeyama et al. |
| 6,054,761 | A | 4/2000 | McCormack et al. |
| 6,069,024 | A * | 5/2000 | Murakami .................. 438/108 |
| 6,163,957 | A | 12/2000 | Jiang et al. |
| 6,326,555 | B1 | 12/2001 | McCormack et al. |

(Continued)

FOREIGN PATENT DOCUMENTS

GB     EP1307075  A2 *  5/2003

(Continued)

OTHER PUBLICATIONS

European International Search Report for Application No. PCT/JP0317019 dated Apr. 13, 2007.

(Continued)

*Primary Examiner*—Ishwarbhai B Patel
(74) *Attorney, Agent, or Firm*—RatnerPrestia (57) ABSTRACT

After disposing metallic foils on either surface of a prepreg sheet of low compressibility having conducting holes filled with conductive paste, the prepreg sheet is compressed in a state of being kept at a relatively low temperature, and after that, the temperature is raised under pressure to melt and harden the resin in the prepreg sheet, and thereby, the connecting resistance is stabilized, and a high-quality circuit board can be obtained.

4 Claims, 5 Drawing Sheets

U.S. PATENT DOCUMENTS

| | | | |
|---|---|---|---|
| 6,353,189 B1 * | 3/2002 | Shimada et al. | 174/255 |
| 6,359,235 B1 * | 3/2002 | Hayashi | 174/260 |
| 6,664,127 B2 * | 12/2003 | Oka et al. | 438/64 |
| 6,761,790 B2 * | 7/2004 | Kawashima et al. | 427/96.2 |
| 7,135,086 B2 * | 11/2006 | Matsuoka | 156/272.2 |
| 2002/0121334 A1 * | 9/2002 | Ikeda et al. | 156/246 |
| 2003/0102153 A1 | 6/2003 | Sugaya et al. | |

FOREIGN PATENT DOCUMENTS

| | | |
|---|---|---|
| JP | 06-268345 | 9/1994 |
| JP | 09-148738 | 6/1997 |
| JP | 09-199829 | 7/1997 |
| JP | 10-242637 | 9/1998 |
| JP | 11-207766 | 8/1999 |
| JP | 2000 156556 A | 6/2000 |
| JP | 2001-155544 | 6/2001 |
| JP | 2001-266643 | 9/2001 |
| JP | 2001-308521 | 11/2001 |

OTHER PUBLICATIONS

Japanese International Search Report for application No. PCT/JP03/017019 dated Mar. 2, 2004.

* cited by examiner

Prepreg sheet compressibility 35%

FIG. 6(b) PRIOR ART

Prepreg sheet compressibility less than 10%

CIRCUIT BOARD

This application is a Divisional of U.S. patent application Ser. No. 10/502,170, filed Jul. 21, 2004, which is a U.S. National Phase application of PCT International application PCT/JP2003/017019, the contents of which are incorporated by reference.

TECHNICAL FIELD

The present invention relates to a circuit board with circuit patterns of surface layers of a double-sided circuit board or multiple layers of multi-layer circuit boards connected with each other in conductive relation, and a manufacturing method for the same.

BACKGROUND ART

Recently, electronic apparatuses are becoming smaller in size and higher in density, and there is a strong demand for multi-layer circuit boards in the field of household use as well as industrial use.

In such a circuit board, it is absolutely necessary to make connections between circuit patterns of multiple layers by a via-hole connecting method, and also, it is required to assure high reliability.

In Japanese Laid-open Patent H6-268345, a high-density circuit board of novel configuration that makes via-hole connection by using conductive paste and its manufacturing method are disclosed. The method of manufacturing the circuit board is described in the following.

The method of manufacturing a conventional double-sided circuit board and multi-layer circuit board, 4-layer circuit board, will be described in the following with reference to FIGS. 4(a)-4(g) and FIG. 5.

First, the method of manufacturing a double-sided circuit board that is a base for a conventional multi-layer circuit board is described.

FIGS. 4(a) to 4(g) are sectional views showing the steps of manufacturing a conventional double-sided circuit board.

Figure 4A:
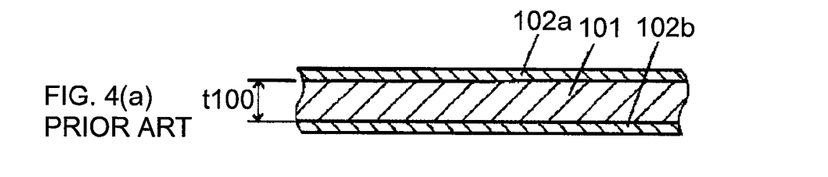
FIGS. 4(a)-4(g) are sectional views showing the manufacturing method for a conventional double-sided circuit board.
Figure 4B:
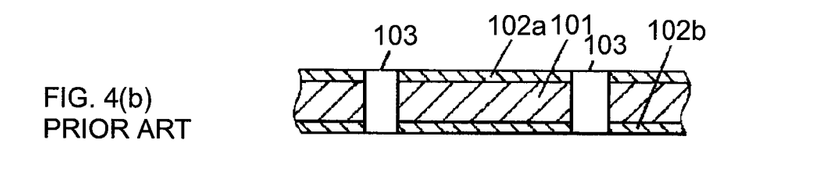
Figure 4C:
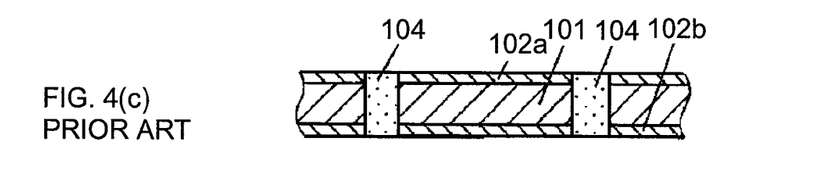
Figure 4D:
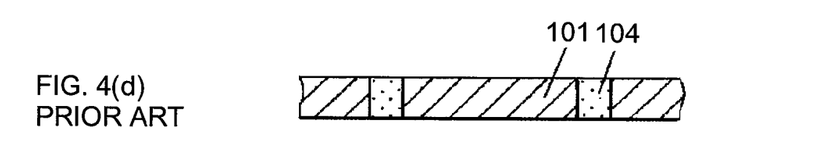
Figure 4E:
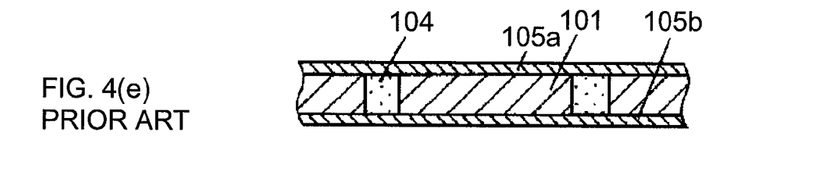
Figure 4F:
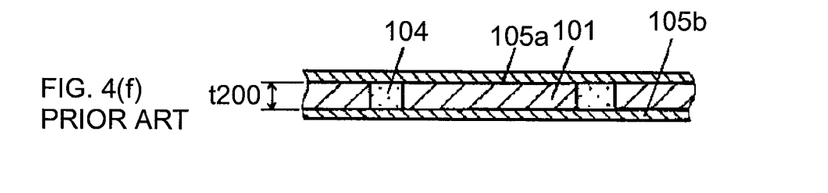
Figure 4G:
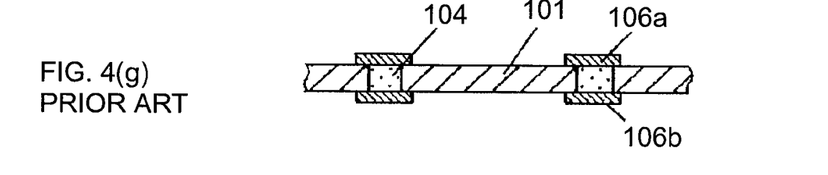

Prepreg sheet 101 is a substrate made from a composite material, non-woven cloth of aromatic polyamide fiber impregnated with thermosetting epoxy resin. For example, thickness t100 is 150 μm, and compressibility is about 35%. Also, selected as prepreg sheet 101 is a porous material having hole portions for attaining compressibility.

One side of releasing film 102a, 102b made of polyethylene terephthalate is coated with Si-based releasing agent. Through-hole 103 is filled with conductive paste 104 electrically connected to metallic foil 105a, 105b such as Cu which is affixed to both surfaces of prepreg sheet 101.

A conventional circuit board and its manufacturing method will be described in the following in accordance with the steps.

First, in the step shown in FIG. 4 (a), releasing films 102a, 102b are bonded to either surface of prepreg sheet 101. In the step shown in FIG. 4 (b), through-hole 103 is formed in a predetermined portion of prepreg sheet 101 by using a laser beam machining process or the like. In the step shown in FIG. 4 (c), conductive paste 104 is filled into through-hole 103 by using a printing method or the like. In the step shown in FIG. 4 (d), releasing films 102a, 102b are removed from the surfaces of prepreg sheet 101. And, in the step shown in FIG. 4 (e), metallic foils 105a, 105b are placed on either surface of prepreg sheet 101.

Next, in the step shown in FIG. 4 (f), a pressure is applied under heat by means of a hot press. As a result, prepreg sheet 101 is compressed to t200 (t200=about 100 μm) in thickness. Simultaneously, prepreg sheet 101 is bonded to metallic foil 105a, 105b, and metallic foils 5 on both surfaces are electrically connected with each other by conductive paste 104 filled in through-hole 103 formed in predetermined position.

Finally, in the step shown in FIG. 4 (g), metallic foils 105a, 105b on both surfaces are selectively etched to form circuit patterns 106a, 106b, thereby obtaining a double-sided circuit board.

Figure 5:
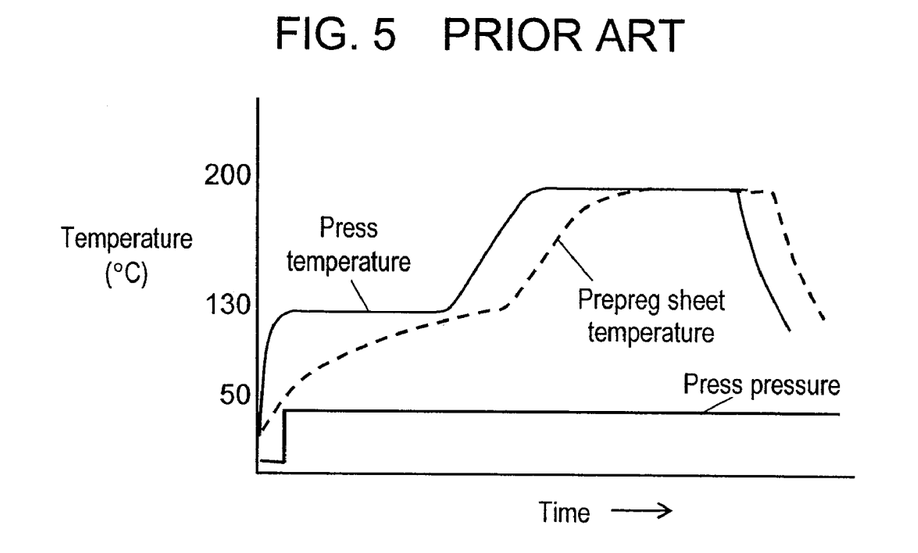
FIG. 5 is a diagram showing a conventional press profile.

In Japanese Laid-open Patent H6-268345, nothing is mentioned about the temperature profile of hot press. Generally, however, taking into account the number of stacks or sheets and quality, as shown in FIG. 5, widely employed are a two-stage pressurizing method in which the pressure is low until reaching a midway point of pressure rise and becomes high thereafter, and a two-stage heating method in which the temperature is kept at around 130° C. where the melting viscosity of resin component of the prepreg sheet is close to the lowest point, and the stacked multiple boards are molded with the temperature of each board nearly kept constant before increasing the temperature up to the hardening temperature.

Namely, great importance is attached to the starting temperature for hardening (molding) of thermosetting resin component in the prepreg sheet, that is, setting and keeping the temperature at a point close to the lowest viscosity due to melting of the thermosetting resin.

However, in the above conventional circuit board and its manufacturing method, if the through-hole is reduced in size and the through-hole forming pitch is narrowed in order to meet the requirement for finer circuit boards, there will arise the following problem.

That is, a prepreg sheet as porous material has hole portions for attaining compressibility. When the percentage of hole portions is high, a part of conductive paste is liable to get into the hole portions, causing the resistance of conducting hole (via-hole) to increase or the insulation between adjacent holes to worsen.

Accordingly, it is preferable to use a material of low hole percentage, but material of low hole percentage is less in compressibility. In that case, there arises a new problem. The new problem is explained with reference to FIGS. 6(a)-6(b).

Figure 6A:
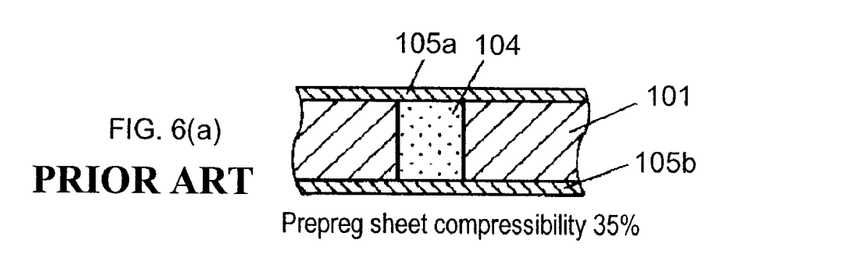
FIGS. 6(a)-6(b) are diagrams showing the problem in a conventional circuit board and its manufacturing method.

As shown in FIG. 6 (a), when prepreg sheet 101 of 35% compressibility is used, conductive paste 104 is able to attain sufficient compression before resin component in prepreg sheet 101 flows in both directions, and therefore, conductive paste 104 will not flow out of the through-hole and stable connecting resistance can be obtained.

Figure 6B:
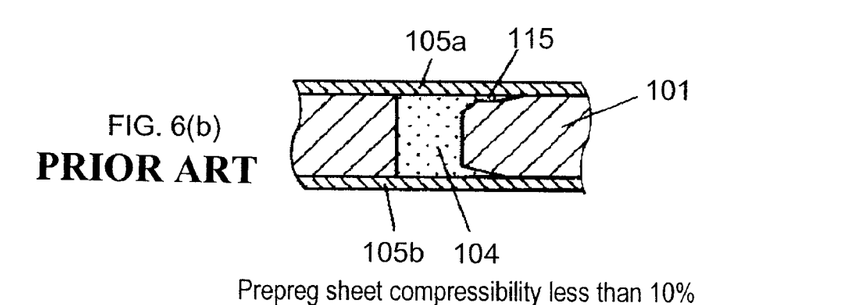

However, when a prepreg sheet of low hole percentage and low compressibility is used, that is, as shown in FIG. 6 (b), when prepreg sheet 101 whose compressibility is less than 10% is used, the compressibility of conductive paste 104 in the step of heating under pressure will become decreased and the pressure welding force of conductive particles in the conductive paste is lowered.

Thus, when the resin component in prepreg sheet 101 heated under pressure is melted and flows in both directions, paste flow 115 will take place as shown in FIG. 5. That is, conductive paste 104 flows out of through-hole 104, increasing the connecting resistance of conducting hole and worsening the quality as a circuit board.

DISCLOSURE OF THE INVENTION

The manufacturing method for a circuit board of the present invention comprises the steps of:

(a) placing a resin-impregnated prepreg sheet and a metallic foil on a substrate;

(b) heating and pressurizing for a specific length of time at the first heating temperature set to a temperature close to the softening point of the resin while pressurizing the prepreg sheet after step (a) at a predetermined pressure; and (c) heating and pressurizing the prepreg sheet after step (b) for a specific length of time at the second heating temperature higher than the first heating temperature.

Also, the manufacturing method for a circuit board of the present invention further comprises the step of:

(d) heating and pressurizing the prepreg sheet after step (c) for a specific time at the third heating temperature higher than the second heating temperature.

The circuit board of the present invention is a circuit board having circuit patterns formed on either surface of a prepreg sheet which is a substrate impregnated with thermosetting resin, and conducting holes filled with conductive paste containing thermosetting resin which are heated under pressure to have conductive relation with through-holes formed in the prepreg sheet, wherein the softening point of thermosetting resin in the conductive paste is lower than the softening point of thermosetting resin in the prepreg sheet.

BRIEF DESCRIPTION OF THE DRAWINGS

FIGS. 2(a)-2(g) are sectional views showing the manufacturing method for a double-sided circuit board in the preferred embodiment of the present invention.

DETAILED DESCRIPTION OF THE PREFERRED EMBODIMENTS

Preferred Embodiment

A circuit board and its manufacturing method in the preferred embodiment of the present invention will be described in the following.

First, a double-sided circuit board and its manufacturing method in the preferred embodiment of the present invention will be described with reference to FIG. 1 and FIGS. 2(a)-2(g).

Figure 2A:
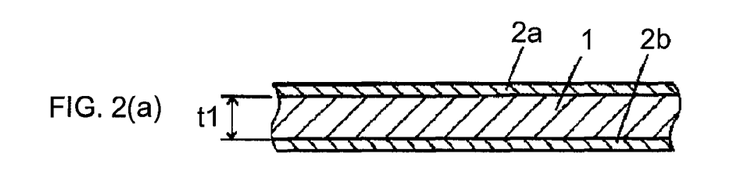
Figure 2B:
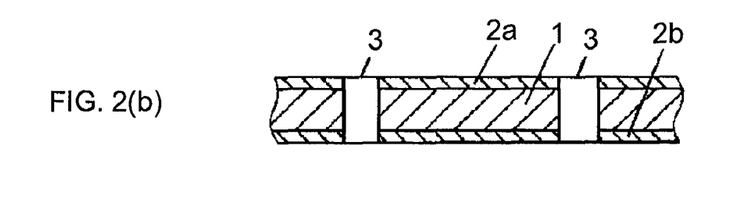

Prepreg sheet 1 is a composite material, non-woven cloth of aromatic polyamide fiber of 250 mm square and about 110 µm thick impregnated with thermosetting epoxy resin. When the temperature is increased at a rate of 3° C./min., the softening point of the thermosetting epoxy resin is about 70° C. Prepreg sheet 1 is in a state of B stage (half hardened) because it is compressed to about 100 µm after hot pressing.

Figure 2C:
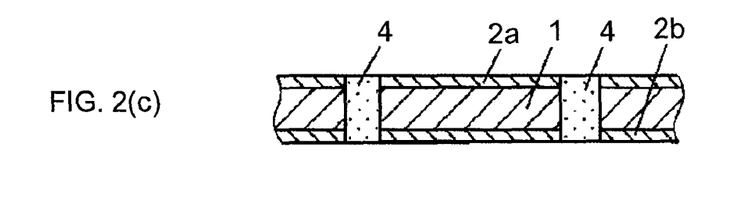
Figure 2D:
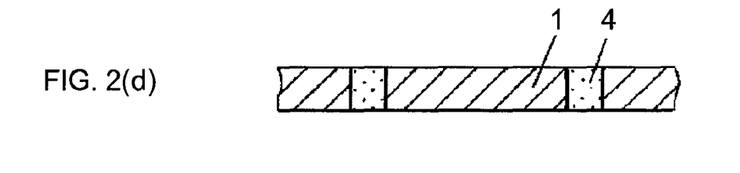
Figure 2G:
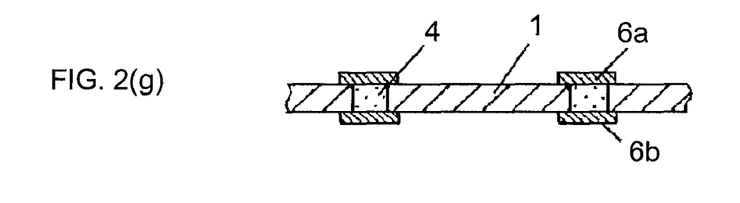
Figure 3A:
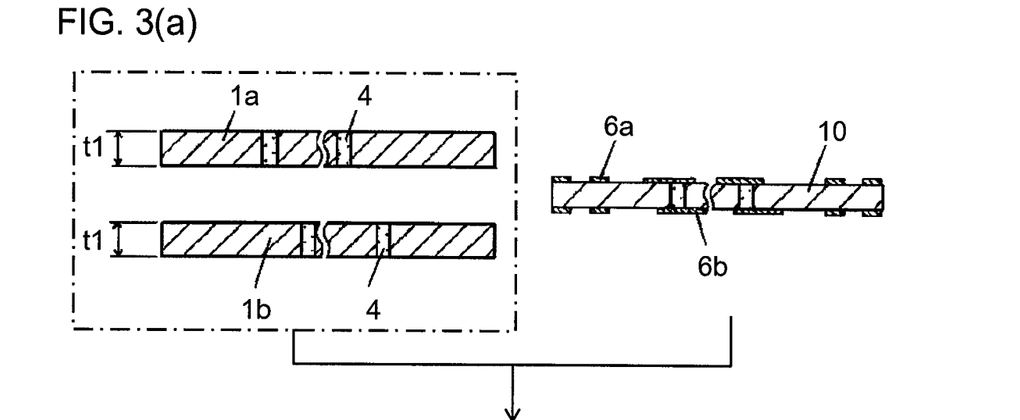
FIGS. 3(a)-3(d) are sectional views showing the manufacturing method for a 4-layer multi-layer circuit board in the preferred embodiment of the present invention.
Figure 3B:
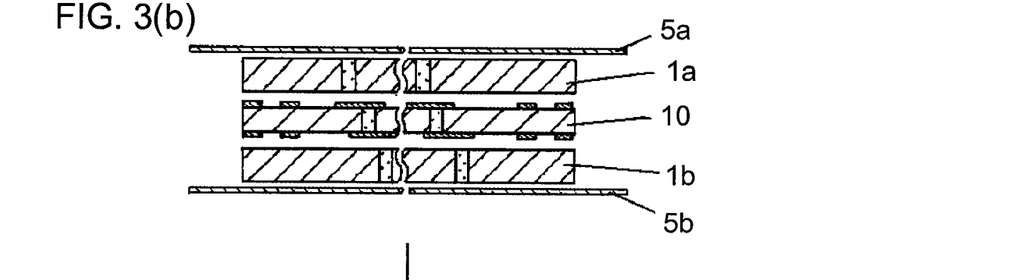
Figure 3C:
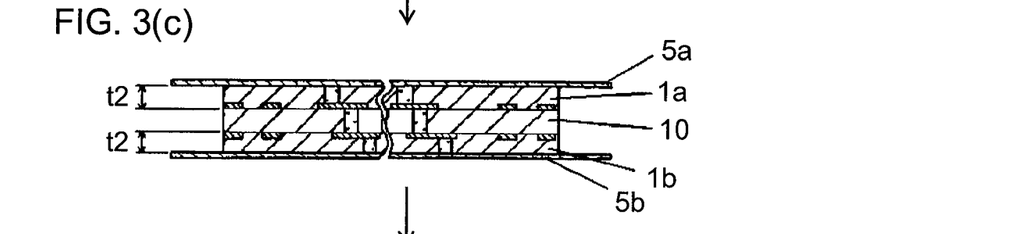
Figure 3D:
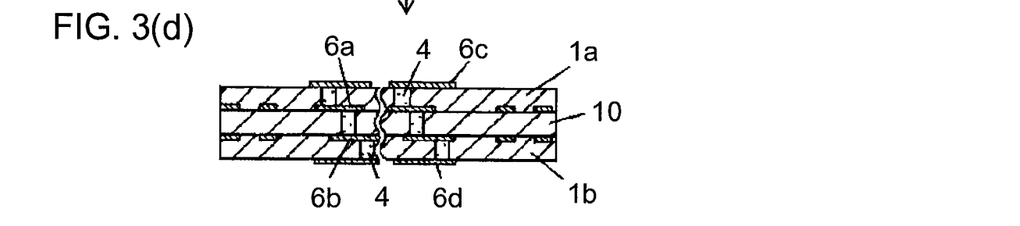

Also, conductive paste 4 filled into through-hole 3 includes conductive filler and thermosetting epoxy resin (non-solvent type) as main components, containing acid anhydride-based hardener. Conductive paste 4 is adequately kneaded by three rolls so that the weight percents become 85 wt %, 12.5 wt %, and 2.5 wt % respectively.

Also, as conductive filler, Cu powder of average grain diameter 2 µm is used, but it is also preferable to use powder of Au, Ag and alloy of these.

Particularly, as thermosetting epoxy resin (non-solvent type), resin used is such that the viscosity due to softening and melting is at the lowest point when the temperature is 70° C. or lower.

The softening temperature of thermosetting epoxy resin (non-solvent type) contained in conductive paste 4 is desirable to be lower than the softening point of thermosetting epoxy resin impregnated in prepreg sheet 1.

The manufacturing method is described in the following in accordance with the steps. In the step shown in FIG. 2 (a), release films 2a, 2b are bonded to either surface of prepreg sheet 1. In the step shown in FIG. 2 (b), through-hole 3 is formed in a predetermined portion of prepreg sheet 1 by means of a laser beam machining process or the like. In the step shown in FIG. 2 (c), conductive paste 4 is filled into through-hole 3 by means of a printing process or the like. In the step shown in FIG. 2 (d), release films 2a, 2b are removed from the surfaces of prepreg sheet 1. In the step shown in FIG. 2 (e), metallic foils 5a, 5b are placed on either surface of prepreg sheet 1.

Next, in the step shown in FIG. 2 (f), heating under pressure is executed. As a result, prepreg sheet 1 is compressed to t2 (t2=about 100 µm) in thickness. Simultaneously, prepreg sheet 1 is bonded to metallic foil 5a, 5b, and metallic foils 5 on both surfaces are electrically connected to each other by conductive paste 4 filled in through-hole 3 provided at a predetermined position.

And, in the step shown in FIG. 2 (g), metallic foils 5a, 5b on the surfaces are selectively etched to form circuit patterns 6a, 6b, thereby obtaining a double-sided circuit board.

The step of heating under pressure shown in FIG. 2 (f) will be described in detail in the following with reference to FIG. 1.

Figure 1:
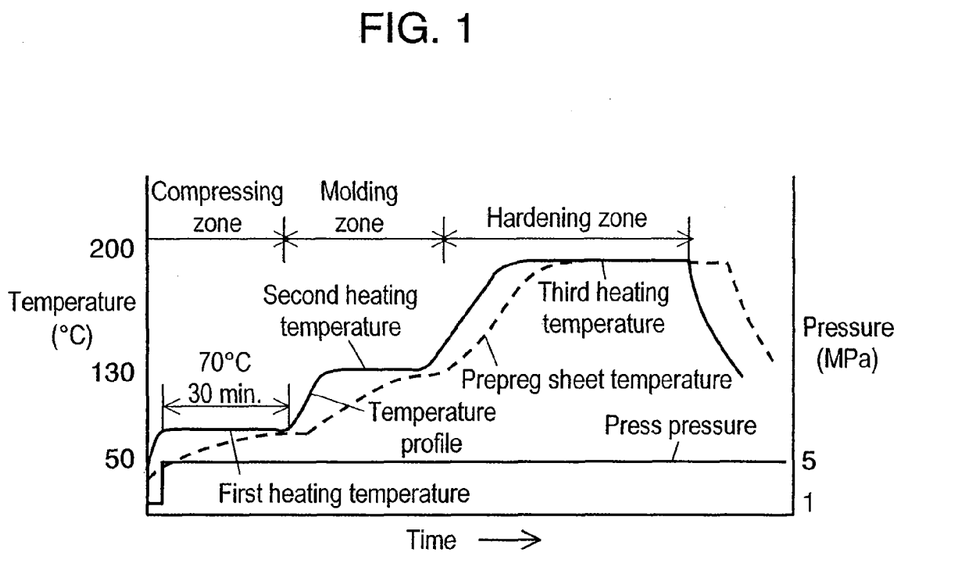
FIG. 1 is a diagram showing a press profile in the preferred embodiment of the present invention.

FIG. 1 is a diagram showing a press profile in the preferred embodiment of the present invention, which refers to the temperature and pressure profile of hot press.

The number of sheets stacked in the hot press device is 10 sheets/stack via a mirror-finished plate such as stainless sheet of about 1 mm thick (not shown). Also, in the press profile are shown only the press temperature, press pressure, and prepreg sheet temperature, and the description of vacuum pressure or the like is omitted for convenience sake.

As shown in FIG. 1, the press profile of the present invention includes three-stage heating steps such as the first heating step (compression zone of conductive paste in the figure), the second heating step (molding zone by resin component in prepreg sheet in the figure), and the third heating step (hardening zone of resin component in prepreg sheet in the figure).

In the temperature profile of the press profile, the heating temperature in the first heating step is such that after steeply raising from normal temperature to 70° C., the temperature is maintained for 30 minutes. The pressure is 5 MPa (Mega Pascal) when the heating temperature reaches 70° C.

In the first heating step, prepreg sheet 1 is slowly heated, maintaining the heating temperature at a level slightly lower than 70° C. for about 10 minutes.

In this first heating step, thermosetting epoxy resin (non-solvent type) component in the conductive paste begins to soften, and the viscosity reaches the lowest point. Thus, conductive paste 4 becomes easier to be deformed by pressures, and is slowly compressed. Accordingly, thermosetting epoxy resin (non-solvent type) is diffused from through-hole 3 to the metallic foil, and at the same time, the pressure welding force of Cu powder in the conductive paste can be increased.

In this connection, take out the prepreg sheet being processed in the first heating step and remove the metallic foils from both surfaces and observe, then it can be confirmed that resin in the conductive paste is diffused to the metallic foils and that the prepreg sheet is slightly molded and reduced in thickness.

Here, the temperature of hot press is set to 70° C. for heating the resin in the prepreg sheet whose softening point is about 70° C. when the temperature is raised at a rate of 3° C./min., but it is also preferable to set the temperature of the prepreg sheet to a level close to the softening point of the resin in the first heating step of the press profile of the present invention. In other words, even in case the temperature of hot press is set to a temperature higher than 70° C., it is preferable to use a proper heating method in order to heat the resin in the prepreg sheet at a temperature close to the softening point of the resin. Also, the heating temperature in the first heating step is set to 70° C., but it is possible to set the temperature in accordance with the softening temperature of resin component in the prepreg sheet.

Next, in the second heating step, with the pressure kept at 5 MPa, the heating temperature is raised at a rate of 3° C./min. up to around 130° C. that is the molding starting temperature of resin component in the prepreg sheet. The molding starting temperature (130° C.) is maintained for about 20 minutes for uniform-quality molding, lessening the variation in temperature of the entire prepreg sheet.

Subsequently, in the third heating step, the temperature is increased at a rate of 3° C./min. up to 200° C. that is the hardening temperature of resin in the prepreg sheet. And, the hardening temperature (200° C.) is maintained for about 60 minutes, and the prepreg sheet is hardened and then cooled.

The pressure is kept at 5 MPa in the third heating step as well, and further maintained until halfway in the cooling thereafter.

When this press profile is used, the temperature of the prepreg sheet itself is close to 70° C. for a specified time in the first heating step, and close to 130° C. for a specified time in the second heating step. And it is maintained at 200° C. for a specified time in the third heating step.

FIGS. 3(a)-3(d) are process sectional views showing the manufacturing steps of a multi-layer board of the present invention, showing an example of 4-layer board.

The manufacturing steps of a multi-layer board will be sequentially described in the following.

In the step shown in FIG. 3 (a), double-sided circuit board 10 manufactured by the steps shown in FIG. 2 (a) to (g) and prepreg sheet 1a, 1b manufactured by the steps shown in FIG. 2 (a) to (d) are prepared. In the step shown in FIG. 3 (b), metal foil 5b, prepreg sheet 1b, double-sided circuit board 10, prepreg sheet 1a, and metallic foil 5a are sequentially positioned and placed on a laminated plate (not shown) as a jig used in the laminating process, on which a laminated plate is placed to make a laminated structure (not shown).

In the step shown in FIG. 3 (c), the laminated structure is subjected to the first heating step, the second heating step and the third heating step. By executing these heating steps, prepreg sheets 1a, 1b are compressed to t2 in thickness, and double-sided circuit board 10 is bonded to metallic foils 5a, 5b. Simultaneously, circuit patterns 6a, 6b are connected to metallic foils 5a, 5b by conductive paste 4 filled in via-holes.

Next, in the step shown in FIG. 3 (d), metallic foils 5a, 5b on the surfaces are selectively etched to form circuit patterns 6c, 6d, thereby obtaining a 4-layer board.

Here, a 4-layer multi-layer board is described, but as to a multi-layer board of more than 4 layers, for example, a 6-layer board, it is preferable to repeat the manufacturing steps of a multi-layer board shown in FIG. 3 (a) to (d), using a 4-layer board obtained by the above manufacturing method in place of a double-sided circuit board.

The connecting resistance of conducting hole (via-hole) in the double-sided circuit board and 4-layer multi-layer circuit board manufactured according to the press profile of the present invention is improved by about 20% as against a conventional circuit board.

Also, it has been confirmed that there is no appearance of conductive paste flowing out around through-hole 3.

In this preferred embodiment, a prepreg sheet that is a non-woven cloth substrate of aromatic polyamide fiber impregnated with thermosetting epoxy resin is used, but it is also preferable to use a woven cloth substrate impregnated with resin material based on thermosetting resin and heated to a B-stage (half-hardened) prepreg sheet.

Also, it is preferable to use B-stage prepreg that is woven or non-woven cloth based on glass fiber impregnated with resin material based on thermosetting resin. Particularly, the effect of the press profile of the present invention is greater when the prepreg sheet is lower in compressibility. For example, in use of a prepreg sheet being less than 10% in compressibility, woven cloth based on glass fiber which is impregnated with thermosetting resin and heated to B stage, it has been confirmed that the connecting resistance of conducting hole is improved by about 30%.

Also, in the preferred embodiment, a 4-layer multi-layer circuit board has been described as a multi-layer circuit board, but similar effects can be obtained by using a multi-layer circuit board having more than 4 layers.

As described above, in the present invention, while maintaining the first heating temperature set to a temperature close to the softening point of impregnated resin of the prepreg sheet, the prepreg sheet is heated and pressurized at a predetermined pressure for a specific length of time. In this way, the resin flow of the prepreg sheet can be suppressed by heating under pressure, and especially, it is effective when a prepreg sheet of low compressibility in lengthwise direction is used.

Also, the present invention is effective on a double-sided circuit board with metallic foils arranged on either surface of a prepreg sheet or a multi-layer circuit board with metallic foils arranged on either outermost surface after positioning and placing prepreg sheets on either surface of a circuit board having two layers or more. While maintaining the first heating temperature set to a temperature close to the softening point of impregnated resin of the prepreg sheet, the prepreg sheet is heated and pressurized at a predetermined pressure for a specific length of time, and thereby, it is possible to enhance the adhesion of different materials such as a conductor circuit of metallic foil on circuit board and a prepreg sheet.

Also, the present invention is especially effective when a prepreg sheet provided with conducting holes filled with conductive paste is employed. The conductive paste is intensively pressurized and enhanced in contact with metallic foils, then the resin component in the conductive paste is diffused to the surfaces of metallic foils. Also, as the pressure welding forces of conductive particles become greater, the conductive paste is hard to flow out against resin melting of the prepreg sheet. As a result, the connecting resistance of conducting hole is stabilized.

In the present invention, the softening point of thermosetting resin in the conductive paste is lower than the softening point of resin in the prepreg sheet, and therefore, it becomes easier to compress the prepreg sheet in such a state that the melting viscosity of resin component of the prepreg sheet is high or the resin is soft but hard to flow. Further, the pressure welding forces of conductive particles in the conductive paste can be increased. Also, deformation of the prepreg sheet due to resin melting of the prepreg sheet becomes lessened. Consequently, the conductive paste becomes hard to flow out because resin flow can be lessened.

Also, at the first heating temperature, softening of resin in the conductive paste is promoted and the viscosity of conductive paste is set to near the lowest point, and thereby, resin component in the conductive paste becomes liable to diffuse to the surfaces of metallic foils. That is, the pressure welding forces of conductive particles can be increased.

Also, in the present invention, the temperature is increased step by step for heating and pressurizing at the first heating temperature set to a temperature close to the softening point of impregnated resin of a prepreg sheet, at the second heating temperature higher than the first heating temperature, and at the third heating temperature set to the hardening temperature of resin in the prepreg sheet. By heating under pressure in this way, it is possible to improve the adhesion between the outermost layers and layers. Also, in the case of a circuit board having conducting holes using conductive paste, it is possible to provide a high-quality circuit board which is stable in connecting resistance.

Also, in the present invention, since a prepreg sheet in a state of B stage having low compressibility is employed, a double-sided or multi-layer circuit board formed as a copper-coated laminated plate is improved in inter-layer adhesion.

Also, in the present invention, since a prepreg sheet using non-woven cloth of aromatic polyamide fiber as the substrate, it is possible to realize a circuit board improved in mechanical strength and reduced in size. Particularly, through-holes can be reduced in diameter. Even in that case, it is possible to provide a high-quality circuit board with stable connecting resistance of conducting hole using conductive paste.

Also, in the present invention, since a prepreg sheet using woven cloth or non-woven cloth of glass fiber as the substrate, it is possible to improve the mechanical and physical strength of the circuit board. Particularly, even in case a prepreg sheet with relatively low compressibility in lengthwise direction is employed with through-holes provided therein, it is possible to provide a high-quality circuit board with stable connecting resistance of through-holes using conductive paste.

INDUSTRIAL APPLICABILITY

As described above, according to the present invention, the resistance values of via-holes connecting circuit boards of individual layers to each other can be decreased, and it is possible to realize a highly reliable circuit board assuring excellent insulation between via-holes, and its manufacturing method.

What we claim:

1. A circuit board comprising:
    a prepreg sheet impregnated with thermosetting resin, the prepreg sheet having a through-hole and a compressibility of less than 10%;
    a conductive paste containing thermosetting resin, the conductive paste filling the through-hole;
    a first circuit pattern formed on a surface of the prepreg sheet; and
    a second circuit pattern formed on another surface of the prepreg sheet,
    wherein a softening point of the thermosetting resin in the conductive paste is lower than a softening point of the thermosetting resin in the prepreg sheet,
    wherein the conductive paste comprises 85 percent by weight conductive filler, 12.5 percent by weight of the thermosetting resin in the through-hole, and 2.5 percent by weight acid anhydride-based hardener, and
    wherein the viscosity of the thermosetting resin in the conductive paste is lowest at a processing temperature in a heating and pressing process.

2. The circuit board of claim 1,
    wherein the prepreg sheet comprises non-woven cloth of aromatic polyamide fiber.

3. The circuit board of claim 1,
    wherein the prepreg sheet comprises woven cloth or non-woven cloth of glass fiber.

4. The circuit board of claim 1,
    wherein the thermosetting resin in the conductive paste is non-solvent type.

\* \* \* \* \*